(12) United States Patent
Muraki

(10) Patent No.: US 6,392,243 B1
(45) Date of Patent: *May 21, 2002

(54) ELECTRON BEAM EXPOSURE APPARATUS AND DEVICE MANUFACTURING METHOD

(75) Inventor: Masato Muraki, Inagi (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/359,909

(22) Filed: Jul. 26, 1999

(30) Foreign Application Priority Data

Jul. 28, 1998 (JP) .......................................... 10-212756

(51) Int. Cl.⁷ ............................................. H01J 37/304

(52) U.S. Cl. ............................... 250/491.1; 250/492.2; 250/398; 250/396 R

(58) Field of Search ........................... 250/491.1, 492.2, 250/398, 396 R

(56) References Cited

U.S. PATENT DOCUMENTS

| | | | |
|---|---|---|---|
| 5,864,142 A | 1/1999 | Muraki et al. | 250/491.1 |
| 5,905,267 A | 5/1999 | Muraki | 250/492.22 |
| 5,912,467 A * | 6/1999 | Okino | 250/491.1 |
| 5,929,454 A | 7/1999 | Muraki et al. | 250/491.1 |
| 6,101,267 A * | 8/2000 | Shiraishi | 382/151 |
| 6,124,596 A * | 9/2000 | Nakasuji et al. | 250/396 ML |

* cited by examiner

Primary Examiner—Bruce Anderson
Assistant Examiner—Nikita Wells
(74) Attorney, Agent, or Firm—Fitzpatrick, Cella, Harper & Scinto

(57) ABSTRACT

An electron optical system for controlling an electron beam to write a pattern detects the position of a stage reference mark on a stage using the electron beam, and a wafer stage position detection unit detects the position of the stage. Based on the detection results, the relative position between the electron beam and stage is specified, and pattern writing is controlled in accordance with this relative position. The electron optical system has an electron optical system reference mark. The electron optical system detects the position of this electron optical system reference mark at predetermined time intervals during pattern writing, and the relative position is corrected on the basis of a variation of that position.

18 Claims, 5 Drawing Sheets

ELECTRON BEAM EXPOSURE APPARATUS
AND DEVICE MANUFACTURING METHOD

BACKGROUND OF THE INVENTION

The present invention relates to an electron beam exposure apparatus and, more particularly, to an electron beam exposure apparatus which can quickly and precisely measure and correct any position variation of an electron beam with respect to a stage that carries an object to be exposed, and a device manufacturing method using the same.

In an electron beam exposure apparatus, the position stability of an electron beam with respect to a stage that carries the object to be exposed is an important factor that determines its work precision. As factors that impair the position stability of an electron beam, an electron beam position variation resulting from charging of a contaminant such as a carbon compound that has become attached inside an electron optical system, and an electron beam position variation arising from a thermal or mechanical deformation of a structure for supporting the electron optical system, the stage, and an interferometer that detects the stage position are known. When the electron beam position has varied, the relationship between the writing coordinate position defined by the electron beam and the coordinate position of the stage defined by the interferometer deviates before or after writing, or during writing, thus impairing the stitching precision and overwriting precision of the patterns to be written.

Conventionally, a displacement between the writing coordinate system and stage coordinate system due to an electron beam position variation is corrected by the following method.

A reference mark is formed on a movable stage which carries a sample such as a wafer or the like. The stage is then moved on the basis of a stage coordinate system defined by the interferometer to locate the reference mark at the design standard irradiation position of an electron beam, and a mark coordinate position (X0, Y0) of the reference mark is obtained by the electron beam. Writing is temporarily stopped during writing, and the stage is moved again to locate the reference mark at the standard irradiation position of the electron beam. The coordinate position of the standard position is detected by the electron beam to obtain a mark coordinate position (X1, Y1) at that time. A difference (ΔX1, ΔY1) between the previous mark coordinate position (X0, Y0) and the current mark coordinate position (X1, Y1) is calculated to obtain the electron beam position variation. Then, the deflection position of the electron beam or stage position is corrected based on this difference (ΔX1, ΔY1). The aforementioned operation is repeated until the end of writing.

However, when the required stitching precision or overwriting precision becomes stricter, the allowable range of electron beam position variations becomes narrower, and electron beam position variations must be corrected more frequently. As a result, a problem, i.e., low throughput of the electron beam exposure apparatus, remains unsolved.

SUMMARY OF THE INVENTION

It is an object of the present invention to provide an excellent electron beam exposure apparatus which can solve the above problems, and a device manufacturing method.

It is another object of the present invention to allow quick correction of the positional relationship between the stage and electron beam upon writing a pattern on a substrate by the electron beam, and to attain both high writing precision and high throughput.

According to one aspect of the present invention, there is provided an electron beam exposure apparatus comprising: a stage which moves while carrying a substrate; a first reference mark fixed onto the stage; an electron optical system for writing a pattern to be written by deflecting an electron beam on the substrate by deflection means, irradiating an object to be irradiated on the stage with the electron beam, detecting electrons reflected by the object, and detecting a position of the object with respect to the electron beam; a second reference mark fixed to the electron optical system and located in a deflection range of the electron beam; a distance measurement system for detecting a position of the stage; and control means for detecting a position of the first reference mark using the electron optical system, detecting the position of the stage at that time using the distance measurement system to obtain a positional relationship of the stage with respect to the electron beam, pre-detecting a position of the second reference mark using the electron optical system, detecting the position of the second reference mark again using the electron optical system upon writing a pattern to be written on the substrate by the electron beam by making the stage and the deflection means cooperate with each other on the basis of the obtained positional relationship between the electron beam and the stage, calculating a difference between the currently detected position and the pre-detected position of the second reference mark, and correcting a relative position between the electron beam and stage using at least one of the deflection means and the stage on the basis of the calculated difference.

Preferably, the control means detects the position of the second reference mark using the electron optical system during writing of the pattern to be written on the substrate by the electron beam, calculates the currently detected position and the pre-detected position of the second reference mark, and corrects the relative position between the electron beam and stage using at least one of the deflection means and the stage on the basis of the calculated difference.

Preferably, the distance measurement system detects the position of the stage relative to the electron optical system.

Preferably, the distance measurement system has a movable mirror fixed to the stage, a reference mirror fixed to a position detection system, and means for irradiating the movable mirror and reference mirror with a laser beam, bringing laser beams reflected by the movable mirror and reference mirror to interference, and detecting that interference light.

According to another aspect of the present invention, there is provided an electron beam exposure method for writing a pattern to be written on a substrate, which is placed on a stage, with an electron beam coming from an electron optical system, comprising the step of detecting a position of a first reference mark fixed to the stage using the electron beam, detecting a position of the stage at that time using a distance measurement system to obtain a positional relationship of the stage with respect to the electron beam, and pre-detecting a position of a second reference mark, which is fixed to the electron optical system and is located in a deflection range of the electron beam, using the electron beam; and the step of detecting the position of the second reference mark again using the electron beam upon writing the pattern to be written on the substrate using the electron beam on the basis of the obtained positional relationship between the electron beam and the stage, calculating a difference between the currently detected position and the pre-detected position of the second reference mark, and correcting a relative position between the electron beam and the stage on the basis of the calculated difference.

The electron beam exposure method preferably further comprises the step of detecting the position of the second reference mark using the electron beam during writing of the pattern to be written on the substrate using the electron beam, calculating the difference between the currently detected position and the pre-detected position of the second reference mark, and correcting the relative position between the electron beam and the stage on the basis of the calculated difference.

Preferably, the distance measurement system detects the position of the stage relative to the electron optical system.

Preferably, the distance measurement system irradiates a movable mirror fixed to the stage and a reference mirror fixed to the electron optical system with a laser beam, brings laser beams reflected by the movable mirror and reference mirror to interference, and detects that interference light.

According to still another aspect of the present invention, there is provided a device manufacturing method for manufacturing a device using the aforementioned electron beam exposure apparatus or method.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

Arrangement of Electron Beam Exposure Apparatus

Figure 1:
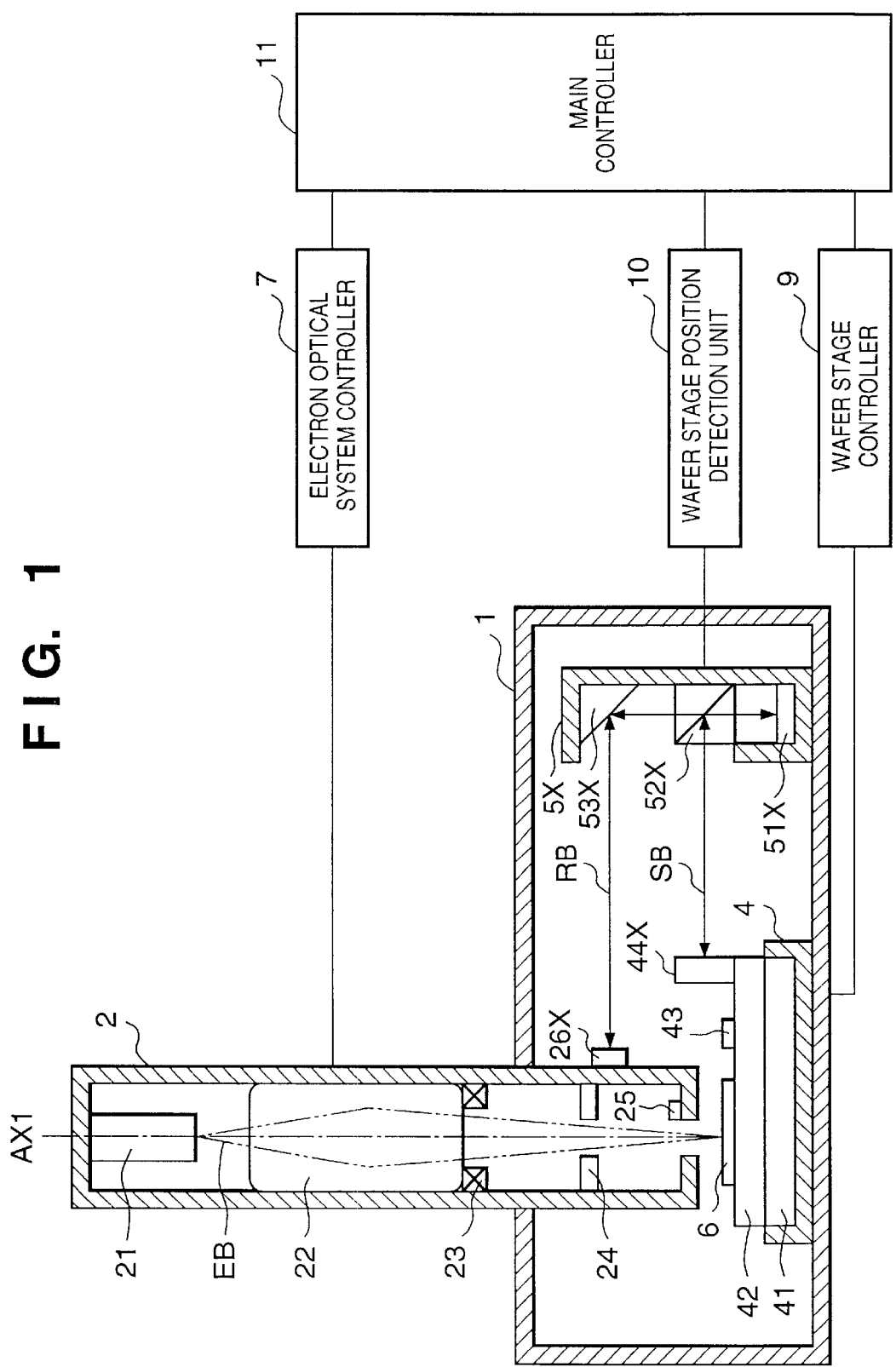
FIG. 1 is a diagram showing an electron beam exposure apparatus according to an embodiment of the present invention.

FIG. 1 shows an electron beam exposure apparatus according to an embodiment of the present invention. This mainly has a main structure 1, electron optical system 2, wafer stage 4, X-stage position distance measurement system 5X, and Y-stage position distance measurement system 5Y (not shown in FIG. 1). The electron optical system 2, wafer stage 4, and X- and Y-stage position distance measurement systems 5X and 5Y are held by the main structure 1.

Figure 2:
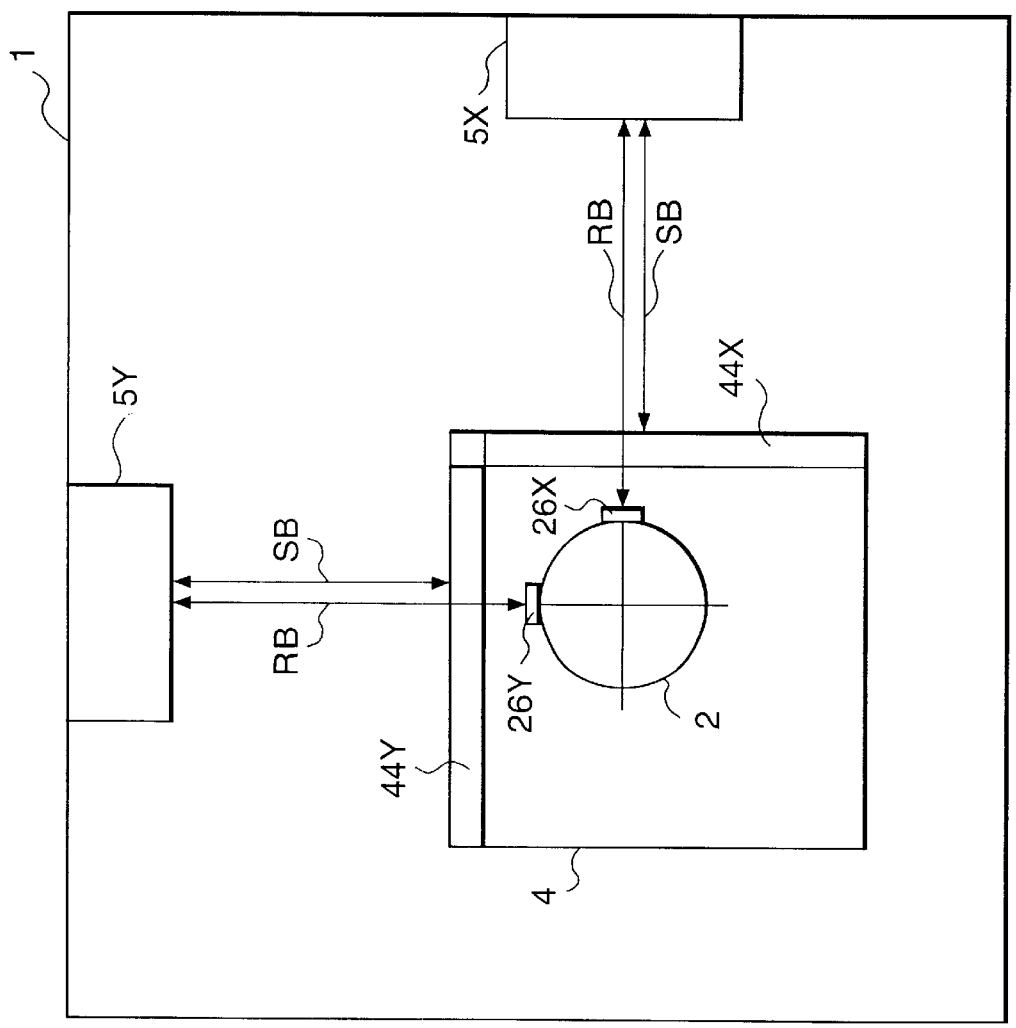
FIG. 2 is a plan view showing the electron beam exposure apparatus according to the embodiment of the present invention.

The electron optical system 2 is built by an electron gun 21 for radiating an electron beam, an electron lens system 22 for converging an electron beam EB coming from the electron gun 21, a deflector 23 for deflecting the electron beam EB, an electron detection system 24 for detecting electrons reflected by the object irradiated with the electron beam EB, and a reference plate 25 formed with an electron optical system reference mark ESM. The respective building components are controlled by an electron optical system controller 7. Upon exposing a wafer 6 by the electron beam EB, the electron optical system controller makes the deflector 23 scan the electron beam EB, and controls irradiation of the electron beam EB in correspondence with each pattern to be written. Upon detecting the position of the object irradiated using the electron beam EB, the electron optical system controller 7 makes the deflector 23 scan the electron beam EB on the object, and makes the electron detection system 24 detect electrons reflected by the object, thus detecting its position. Note that the electron optical system reference mark ESM is located within the deflection range of the electron beam EB, and its position can be detected by the electron beam EB. As also shown in FIG. 2 as a plan view of the electron beam exposure apparatus of this embodiment, X- and Y-reference mirrors 26X and 26Y are fixed to an electron optical system structure that hold the respective components of the electron optical system 2.

The wafer stage 4 is constructed by placing an X-stage 42 on a Y-stage 41, and the wafer 6 applied with a photosensitive material is held on the X-stage 42. Furthermore, a reference mark SSM is placed at a position on the X-stage 42 different from that of the wafer 6, and an X-movable mirror 44X and a Y-movable mirror 44Y (not shown in FIG. 1) are respectively placed at one end of the X- and Y-directions on the X-stage 42. The Y-stage 41 aligns the wafer 6 in the Y-direction perpendicular to the page of FIG. 1 in a plane perpendicular to an optical axis AX1 of the electron lens system 22, and the X-stage 42 aligns the wafer 6 in the X-direction perpendicular to the Y-axis in the plane perpendicular to the optical axis AX1 of the electron lens system 22. Note that a Z-stage and the like (not shown) for aligning the wafer in the Z-direction parallel to the optical axis AX1 of the electron optical system 22 are also placed on the X-stage 42. The Y-stage 41 and X-stage 42 are controlled by a wafer stage controller 9.

In the X-stage position distance measurement system 5X, a laser beam emerging from an interferometer main body 51X is split by a beam splitter 52X into a distance measurement beam SB and reference beam RB. The distance measurement beam SB travels toward the X-movable mirror 44X, is reflected by the mirror 44X, and then returns to the beam splitter 52X again. The reference beam RB travels toward the X-reference mirror 26X via an X-reflecting prism 53X, is reflected by the mirror 26X, and returns to the beam splitter 52X again via the X-reflecting prism 53X, as shown in FIGS. 1 and 2. The two beams SB and RB which have returned to the beam splitter 52X enter a receiver included in the interferometer main body 51X. Upon leaving the beam splitter 52X, the distance measurement beam SB and reference beam RB have frequencies different by a small amount $\Delta f$, and the receiver outputs a beat signal whose frequency has changed from $\Delta f$ in correspondence with the moving speed of the X-movable mirror 44X in the X-direction. When this beat signal is processed by a wafer stage position detection unit 10, the change amount of the optical path length of the distance measurement beam RB with reference to the optical path length of the reference beam RB, i.e., the X-coordinate value of the X-movable mirror 44X fixed to the wafer stage with reference to the X-reference mirror 26X fixed to the electron optical system, can be measured with high resolution and precision. Likewise, the Y-stage position distance measurement system 5Y shown in FIG. 2 measures the Y-coordinate value of a Y-movable mirror 44Y fixed to the wafer stage with reference to the Y-reference mirror 26Y fixed to the electron optical system 2 with high resolution and precision.

A main controller 11 processes data output from the electron optical system controller 7, wafer stage position detection unit 10, and wafer stage controller 9, and supplies commands and the like to these controllers.

Exposure Operation

The exposure operation of the electron beam exposure apparatus of this embodiment will be explained below with the aid of FIG. 3.

Prior to the description, a coordinate system will be explained. The exposure apparatus of this embodiment has a stage coordinate system defined by the wafer stage controller 9, and a writing coordinate system defined by the electron optical system controller 7. The X- and Y-axes of the stage coordinate system XY represent the moving directions of the X-stage 42 and Y-stage 41 (or coordinate measurement directions by the X- and Y-stage position distance measurement systems 5X and 5Y), and the x- and y-axes of the writing coordinate system xy represent the deflection directions of the electron beam. Note that the origins of these two coordinate systems are defined to match the reference position (optical axis AX1) of the electron beam.

Figure 3:
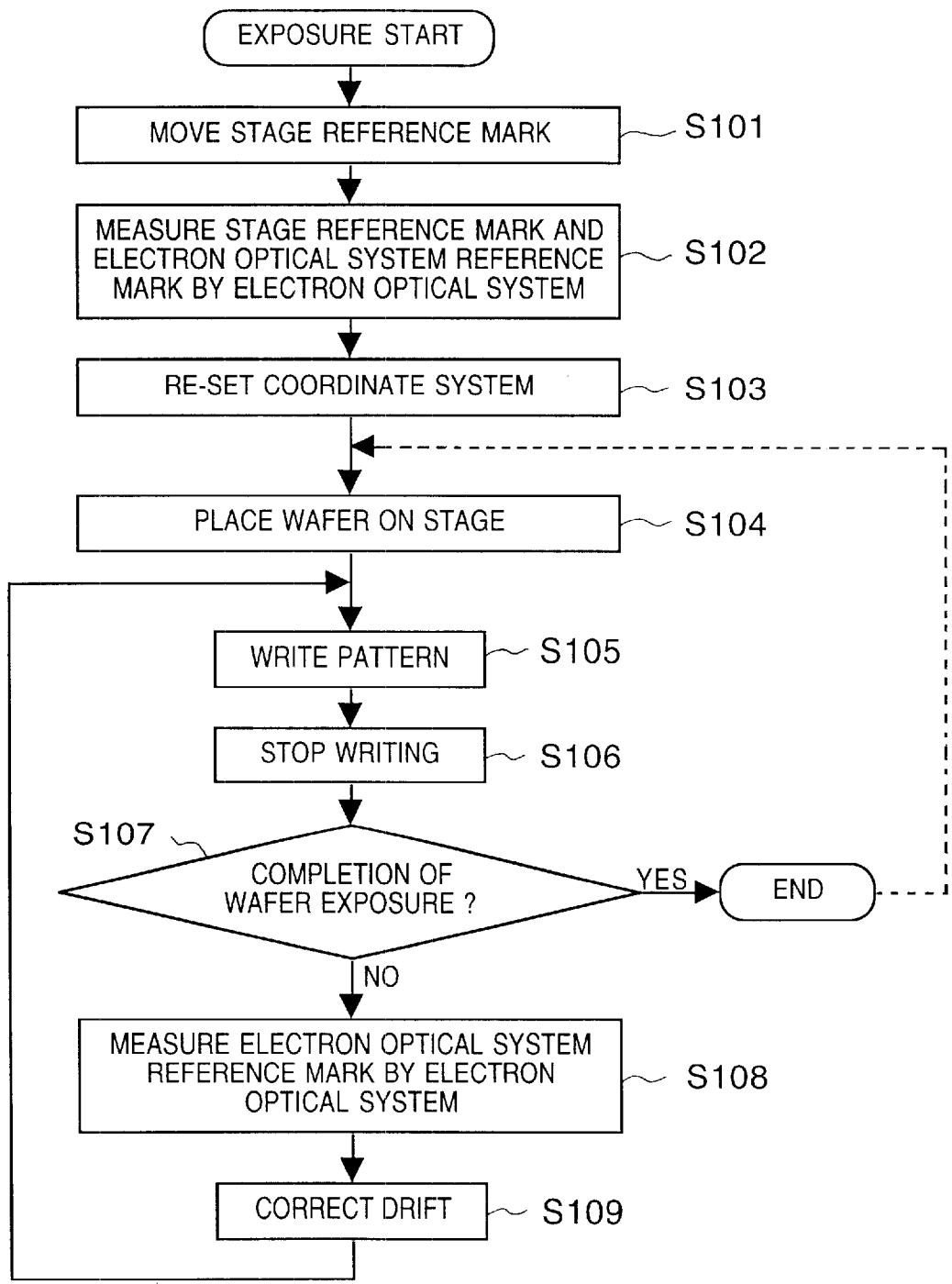
FIG. 3 is a flow chart for explaining the exposure processes according to the embodiment of the present invention.

Upon starting exposure, the main controller 11 executes the following steps (see FIG. 3).

(Step S101)

The main controller 11 directs the wafer stage controller 9 to move the X-stage 42 so as to locate the stage reference mark SSM on the optical axis AX1 of the electron optical system 2 (movement of the X-stage 42 means to move the X-stage 42 by making the wafer stage controller 9 and wafer stage position detection unit 10 cooperate with each other; the same applies to the following description). The same applies to driving of the Y-stage 41.

(Step S102)

The main controller 11 directs the electron optical system controller 7 to scan the stage reference mark SSM with the electron beam coming from the electron optical system 2, and directs the electron detection system 24 to detect electrons reflected by the stage reference mark SSM, thereby detecting the position of the stage reference mark SSM. In this way, the position displacement of the stage reference mark SSM from the electron beam reference position is detected. Also, the main controller 11 directs the electron optical system controller 7 to scan the electron optical system reference mark ESM with the electron beam coming from the electron optical system 2, and directs the electron detection system 24 to detect electrons reflected by the electron optical system reference mark ESM, thereby detecting the position of the electron optical system reference mark ESM. In this manner, the coordinate position (x0, y0) of the electron optical system reference mark ESM with respect to the electron beam reference position is detected.

(Step S103)

The main controller 11 re-sets the stage coordinate system defined by the wafer stage position detection unit 10 or the writing coordinate system defined by the electron optical system controller 7 on the basis of the position displacement of the stage reference mark SSM with respect to the electron beam reference position, which is detected in step S102. As a result, the positional relationship (relative position) between the electron beam EB and X-stage 42 is determined.

(Step S104)

A wafer is placed on the wafer stage 4.

(Step S105)

A pattern is written on the wafer 6 while deflecting the electron beam EB and moving the X-stage on the basis of the positional relationship between the electron beam EB and X-stage 42.

(Step S106)

If the writing time in step S105 has exceeded a first predetermined time, writing is stopped.

(Step S107)

If all areas to be written on the wafer 6 have been written, exposure of the wafer is completed. Then, the wafer 6 is removed from the wafer stage 4. The flow returns to step S104 to process the next, new wafer. If a second predetermined time longer than the first predetermined time has elapsed, the flow returns to step S101 to re-set the relative positional relationship between the electron beam and wafer stage 4 using the stage reference mark SSM. If all areas to be written on the wafer 6 have not been written, the flow advances to step S8.

(Step S108)

The electron optical system reference mark ESM is scanned with the electron beam EB coming from the electron optical system 2, and electrons reflected by the electron optical system reference mark ESM are detected by the electron detection system 24, thereby obtaining a coordinate position (x1, y1) of the electron optical system reference mark ESM at that time.

(Step S109)

A difference (Δx1, Δy1) between the previous coordinate position (x0, y0) and the current coordinate position (x1, y1) of the electron optical system reference mark ESM is considered as an electron beam position variation value (drift value) during writing, and the deflection position of the electron beam or wafer stage position is corrected on the basis of the position displacement (Δx1, Δy1). The flow then returns to step S105.

The characteristic features of this embodiment described above will be explained below.

In the conventional electron beam exposure apparatus, the following two variations are added, and their sum appears as a position variation of the electron beam with respect to the stage.

(1) The position of the electron beam varies with respect to the electron optical system 2 due to charging of a contaminant such as a carbon compound or the like that has become attached inside the electron optical system.

(2) The position of the electron optical system 2 varies with respect to the drive origin of the wafer stage 4 due to thermal or mechanical deformations of the main structure 1 and the like.

The time variation of (2) is smaller than that of (1). For this reason, in this embodiment, the correction process that uses the electron optical system reference mark ESM and does not require any stage movement is executed for a variation of type (1) at short time intervals (first predetermined time), and the correction process that uses the electron optical system reference mark ESM and requires stage movement is executed for a variation of type (2) at long time intervals (second predetermined time). That is, since correction which must be done frequently is executed at short time intervals, a decrease in throughput due to correction can be minimized. Furthermore, since the X- and Y-reference mirrors 26X and 26Y are fixed to the electron optical system 2, the position of the wafer stage 4 is measured with reference to the electron optical system 2, thus always correcting a variation of type (2).

Device Manufacturing Method

An embodiment of a device producing method using the above-described exposure apparatus will be described below.

Figure 4:
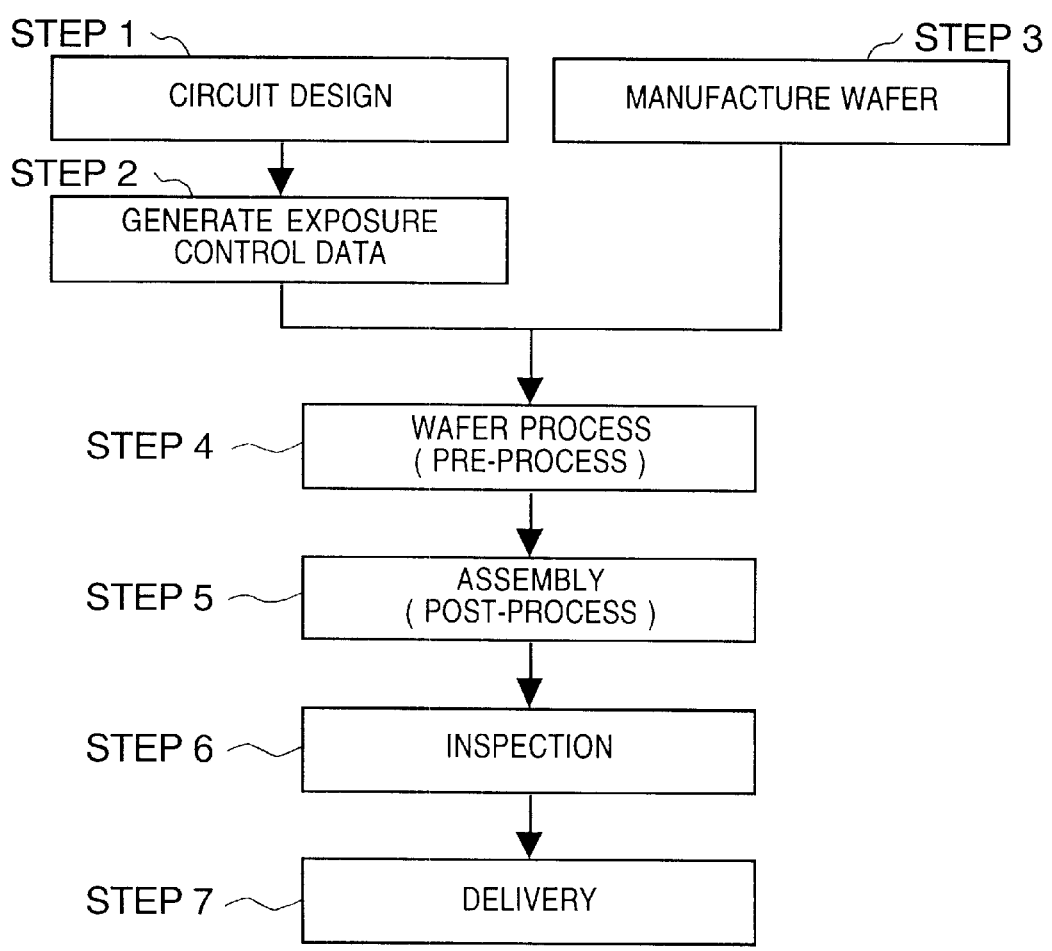
FIG. 4 is a flow chart for explaining the manufacturing flow of a microdevice.

FIG. 4 shows the flow in the manufacture of a microdevice (semiconductor chips such as LSIs, ICs, or the like, liquid crystal panels, CCDs, thin film magnetic heads, micromachines, and the like). In step 1 (circuit design), the circuit design of a semiconductor device is made. In step 2 (exposure control data generation), exposure control data of an exposure apparatus is generated based on the designed circuit pattern. In step 3 (fabricate wafer), a wafer is fabricated using materials such as silicon and the like. Step 4 (wafer process) is called a pre-process, and an actual circuit is formed by lithography using the exposure apparatus with exposure control data, and a wafer. The next step 5 (assembly) is called a post-process, in which semiconductor chips are assembled using the wafer obtained in step 4, and includes an assembly process (dicing, bonding), a packaging process (encapsulating chips), and the like. In step 6 (inspection), inspections such as operation confirmation tests, durability tests, and the like of semiconductor devices assembled in step 5 are run. Semiconductor devices are completed via these processes, and are delivered (step 7).

Figure 5:
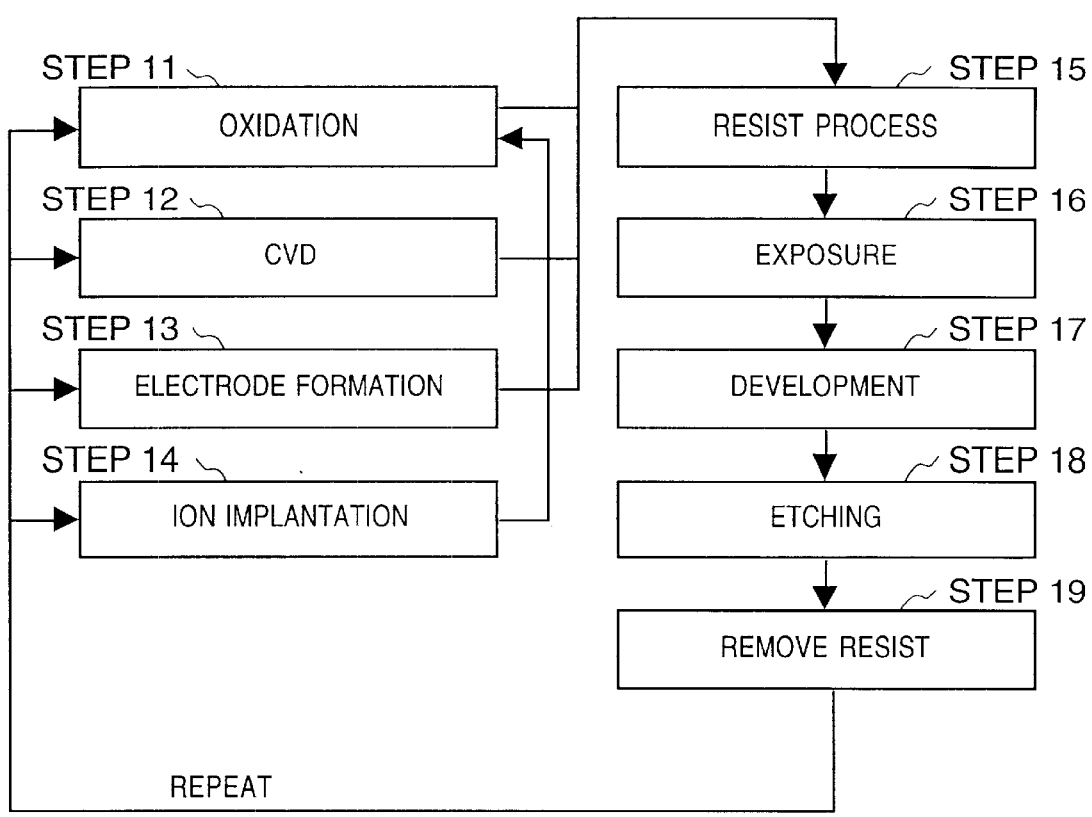
FIG. 5 is a flow chart for explaining the wafer process.

FIG. 5 shows the detailed flow of the wafer process. In step 11 (oxidation), the surface of the wafer is oxidized. In step 12 (CVD), an insulating film is formed on the wafer surface. In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern on the mask is printed on the wafer by exposure using the electron beam exposure apparatus. In step 17 (development), the exposed wafer is developed. In step 18 (etching), a portion other than the developed resist image is removed by etching. In step 19 (remove resist), the resist film which has become unnecessary after etching is removed. By repeating these steps, multiple circuit patterns are formed on the wafer.

Using the manufacturing method of this embodiment, highly integrated semiconductor devices, which are hard to manufacture by the conventional method, can be manufactured with low cost.

According to the present invention, the position variations of the electron beam with respect to the stage are classified into two variation factors, and correction processes suitable for the individual variation factors are done, thus minimizing a decrease in throughput due to correction in the electron beam exposure apparatus. When a device is manufactured using such a method, a device with a higher precision than the conventional one can be manufactured.

As many apparently widely different embodiments of the present invention can be made without departing from the spirit and scope thereof, it is to be understood that the invention is not limited to the specific embodiments thereof except as defined in the appended claims.

What is claimed is:

1. An electron beam exposure apparatus for writing a pattern on a substrate using an electron beam, said apparatus comprising:

a stage which moves while carrying the substrate;

a first reference mark formed on said stage;

an electron optical system for writing a pattern on the substrate by deflecting the electron beam, and detecting over time (i) a position of the first reference mark and (ii) a position of a second reference mark, by irradiating the marks with the deflected electron beam;

a second reference mark which is formed on said electron optical system to fall within a deflection range of the electron beam deflected by said electron optical system;

control means for specifying a first relative position between said stage and the electron beam on the basis of a position of said first reference mark detected by said electron optical system, and controlling writing of the pattern on the substrate on the basis of the first relative position; and correction means for specifying a second relative position between said electron optical system and the electron beam on the basis of a position of said second reference mark detected by said electron optical system, and correcting the first relative position on the basis of an amount of variation with an elapse of time of the detected second relative position.

2. The apparatus according to claim 1, further comprising:

distance measurement means for detecting a position of said stage, wherein said control means specifies the relative position on the basis of the position of the first reference mark upon detecting said first reference mark, and the position of said stage detected by said distance measurement means.

3. The apparatus according to claim 2, wherein said distance measurement means detects a position of said stage relative to said electron optical system.

4. The apparatus according to claim 3, wherein said distance measurement means comprises a first mirror fixed to said stage, a second mirror fixed to said electron optical system, and detection means for irradiating said first and second mirrors with a laser beam, bringing laser beams reflected by said first and second mirrors to interference, and detecting a relative position between said first and second mirrors.

5. The apparatus according to claim 1, wherein said correction means corrects the relative position by adjusting at least one of deflection of said electron optical system and driving of said stage on the basis of a change in position of said second reference mark along with an elapse of time, which is detected by said electron optical system.

6. The apparatus according to claim 1, wherein a time interval of detecting said first reference mark is longer than a time interval of detecting said second reference mark.

7. The apparatus according to claim 1, wherein said correction means measures the position of said second reference mark at a predetermined time interval, calculates a difference between the currently detected position and the previously detected position of said second reference mark, and corrects the relative position on the basis of the calculated difference during writing of the pattern by said control means.

8. A method of controlling an electron beam exposure apparatus which comprises a stage which moves while carrying the substrate, and an electron optical system for writing a pattern on the substrate by deflecting an electron beam, and detecting over time (i) a position of a first reference mark and (ii) a position of a second reference mark by irradiating the marks with the deflected electron beam, and which writes a pattern on the substrate using the electron beam, said method comprising:

the specifying step of detecting a position of the first reference mark formed on the stage using the electron optical system, and specifying a first relative position between said stage and the electron beam on the basis of the detected position;

the control step of controlling writing of the pattern on the substrate on the basis of the first relative position specified in the specifying step; and the correction step of detecting a position of the second reference mark, which is formed on the electron optical system to fall within a deflection range of the electron beam deflected by the electron optical system, specifying a second relative position between the electron optical system and the electron beam on the basis of a position of the second reference mark and correcting the first relative position on the basis of an amount of variation with an elapse of time of the detected second relative position.

9. The method according to claim 8, wherein the control step includes the step of detecting a position of the first reference mark, detecting a position of the stage at that time, and specifying the relative position on the basis of the detected position of the first reference mark and the detected stage position.

10. The method according to claim 9, wherein a position of the stage relative to the electron optical system is detected upon detecting the position of the stage.

11. The method according to claim 10, wherein the position of the stage is detected by irradiating a first mirror fixed to the stage and a second mirror fixed to the electron optical system with a laser beam, bringing laser beams reflected by the first and second mirrors to interference, and detecting a relative position between the first and second mirrors.

12. The method according to claim 8, wherein the correction step includes the step of correcting the relative position by adjusting at least one of deflection of the electron optical system and driving of the stage on the basis of a change in position of the second reference mark along with an elapse of time, which is detected by the electron optical system.

13. The method according to claim 8, wherein a time interval of an execution of the specifying step is longer than a time interval of an execution of the correction step.

14. The method according to claim 8, wherein the correction step includes the step of measuring the position of the second reference mark at a predetermined time interval, calculating a difference between the currently detected position of the second reference mark and the previously detected position of the second reference mark, and correcting the relative position on the basis of the calculated difference during writing of the pattern in the control step.

15. An electron beam exposure method for writing a pattern on a substrate placed on a stage using an electron beam coming from an electron optical system, said method comprising:

the step of detecting a position of a first reference mark fixed to the stage using the electron beam, detecting a position of the stage at that time using distance measurement means to obtain a first relative position between the stage and the electron beam, and pre-detecting a position of a second reference mark, which is fixed to the electron optical system to fall within a deflection range of the electron beam, using the electron beam, so as to pre-specify a second relative position between the electron optical system and the electron beam; and the step of detecting the position of the second reference mark again using the electron beam, to specify a second relative position between the electron optical system and the electron beam, calculating a difference between the currently specified second relative position and the pre-specified second relative position of the second reference mark, and correcting the first relative position on the basis of the calculated difference, upon writing the pattern on the substrate using the electron beam on the basis of the obtained first relative position between the electron beam and the stage.

16. The method according to claim 15, wherein the relative positional relationship is corrected during writing of the pattern on the substrate using the electron beam.

17. The method according to claim 15, wherein a position of the stage relative to the electron optical system is detected upon detecting the position of the stage using the distance measurement means.

18. A device manufacturing method for manufacturing a device comprising:

a supplying step of supplying a substrate to an electron beam exposure apparatus; and an exposing step of writing a pattern on the substrate using the electron beam exposure apparatus, wherein the electron beam exposure apparatus writes a pattern on a substrate using an electron beam, and comprises:

a stage which moves while carrying the substrate;

a first reference mark formed on the stage;

an electron optical system for writing a pattern on the substrate by deflecting the electron beam, and detecting overtime (i) a position of the first reference mark and (ii) a position of a second reference mark by irradiating the marks with the deflected electron beam;

a second reference mark which is formed on the electron optical system to fall within a deflection range of the electron beam deflected by the electron optical system;

control means for specifying a first relative position between the stage and the electron beam on the basis of a position of the first reference mark detected by the electron optical system, and controlling writing of the pattern on the substrate on the basis of the first relative position; and correction means for specifying a second relative position between the electron optical system and the electron beam on the basis of a position of the second reference mark detected by the electron optical system, and correcting the first relative position on the basis of an amount of variation with an elapse of time of the detected second relative position.

* * * * *